United States Patent
Holmdahl et al.

(10) Patent No.: US 10,321,588 B1
(45) Date of Patent: Jun. 11, 2019

(54) METHODS AND SYSTEMS FOR A FLEXIBLE BATTERY

(71) Applicant: Amazon Technologies, Inc., Seattle, WA (US)

(72) Inventors: Bryan Holmdahl, Santa Clara, CA (US); James Robert Lim, San Jose, CA (US); Yuting Yeh, Sunnyvale, CA (US); David Wang, Santa Clara, CA (US); Kok Yen Cheng, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 58 days.

(21) Appl. No.: 15/276,417

(22) Filed: Sep. 26, 2016

(51) Int. Cl.
- *H01M 2/26* (2006.01)
- *H01M 10/052* (2010.01)
- *H05K 5/00* (2006.01)
- *H01M 2/02* (2006.01)
- *H01M 10/04* (2006.01)
- *H05K 5/02* (2006.01)

(52) U.S. Cl.
CPC ........ *H05K 5/0086* (2013.01); *H01M 2/0207* (2013.01); *H01M 2/0275* (2013.01); *H01M 10/0431* (2013.01); *H01M 10/0436* (2013.01); *H05K 5/0017* (2013.01); *H05K 5/023* (2013.01); *H05K 5/0217* (2013.01); *H01M 2220/30* (2013.01)

(58) Field of Classification Search
CPC .... H05K 5/0086; H05K 5/023; H05K 5/0217; H05K 5/0017; H01M 2/0207; H01M 2/0275; H01M 10/0431; H01M 2220/30; H01M 10/0436
USPC ..................................................... 361/679.55
See application file for complete search history.

(56) References Cited

U.S. PATENT DOCUMENTS

| | | | |
|---|---|---|---|
| 2014/0072850 A1* | 3/2014 | Kwon | H01M 10/0463 429/94 |
| 2014/0087224 A1* | 3/2014 | Kim | H01M 2/266 429/94 |
| 2014/0120394 A1* | 5/2014 | Kwon | H01M 10/0463 429/94 |

\* cited by examiner

*Primary Examiner* — Rockshana D Chowdhury
(74) *Attorney, Agent, or Firm* — Eversheds Sutherland (US) LLP (57) ABSTRACT

Systems, methods, and computer-readable media are disclosed for a flexible battery. The systems, methods, and computer-readable media described herein may improve user experiences and prolong the battery's life. In an example embodiment described herein, a flexible battery may comprise a first battery portion positioned in a grip portion and having a first thickness, and a second battery portion positioned in a second portion having a second thickness that is less than the first thickness, wherein the second battery portion is bendable in the at least one direction, and the first battery portion is rigid.

16 Claims, 7 Drawing Sheets

METHODS AND SYSTEMS FOR A FLEXIBLE BATTERY

BACKGROUND

Electronic devices are now an integral part of everyday life. Many of the electronic devices that are widely used are mobile devices (e.g., mobile phones, laptops, tablets, and/or the like). These devices require power to operate. Often power is provided to such devices, at least partially, via a battery. Such batteries may be designed to include different features (e.g., long life, flexibility, small size, and/or the like). Such features may directly relate to the user experience. For example, the battery may define how long an electronic device can operate before recharging. In some instances, different desirable features may be difficult to incorporate into a single battery. For example, the size of a battery may likely limit the amount of charge it can hold or how long an electronic device can operate without recharging. The size of the battery may be, for example, limited by an enclosure of a device being powered by the battery.

Naturally, the ability to enhance the performance of batteries without sacrificing other features similar to the features described above can enhance the user experience and satisfaction. Accordingly, there exists a dire market need for systems and methods that can improve the performance of batteries while maintaining features similar to the features described above.

BRIEF DESCRIPTION OF THE DRAWINGS

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components as well. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

This disclosure relates to, among other things, systems, methods, computer-readable media, techniques, and methodologies for a flexible battery having an improved performance.

Generally, a battery (e.g., a pouch battery) may be configured to facilitate powering mobile electronic devices (e.g., mobile phones, tablets, remote controllers and/or the like) and/or other electronic devices (desktop computers, alarm systems, and/or the like).

Batteries may have one or more elastic surfaces (e.g., an elastic shell). For example, some portions of a battery may be less or more rigid than other portions of the battery. In one embodiment of the disclosure, a flexible battery is configured for placement in a flexible bendable housing. The flexible bendable housing may be, for example, a housing for a tablet configured for bending in a particular direction. The housing may include mechanical elements that prevent the housing from bending in directions different from the particular direction. In some implementations, the user may be able to provide user interactions to the tablet by, for example, bending the tablet.

However, in order to facilitate operation and/or manufacturing of a bendable tablet, internal components of the tablet may accommodate the bending of the tablet and/or tablet housing. For example, a battery powering the tablet may be bendable in the particular direction. In one implementation, cathodes and anodes (e.g., layers) may be configured to accommodate bending in one direction. For example, the flexible battery may include a top portion and a bottom portion. In one implementation, when the flexible battery is bent in, for example, a downward direction the top layer may experience tension from being stretched while the bottom layer may experience compression. Accordingly, layers of the battery adjacent to the top portion may be designed to be longer than layers of the battery adjacent the bottom portion. Accordingly, the flexible battery may maintain electrical connection easier during the bending of the flexible battery. The overall stress on the battery during the bending may also be reduced according to this design.

Other constraints may also be considered. In some implementations, it may be desirable to maximize the amount of charge a battery can hold and/or the battery life. Generally, the size of the battery is proportional to an amount of charge a battery can hold. Therefore, in some implementations, it is desirable to fully utilize space available within the tablet housing for the battery in order to increase the amount of charge that the battery can hold. Methods and systems are described herein for generating and manufacturing a battery according to the example parameters above.

Embodiments of the disclosure may improve the user experience and increase the amount of charge a flexible battery can hold. Additionally, embodiments of the disclosure also provide for a device design that increases reliability and reduces malfunctions of the device. For example, a flexible device may withstand more force (e.g., drops) than a non-flexible device before breaking. In one implementation, the flexible battery described is configured for placement in a bendable tablet housing. The battery may be configured for bending in a particular direction. In one implementation, the battery may be designed to withstand pressure created by bending the battery within the housing in the particular direction. For example, a surface of the battery that is stretched during the bending of the tablet in the particular direction may be slightly longer than an opposing edge that is contracted during the bending of the tablet. The above allows for placement of flexible batteries in bendable tablets or bendable tablet housings and ensures safe operation of the bendable tablet. Accordingly, the user experience is improved by allowing the user to provide instructions to the tablet by bending the tablet. Additionally, the amount of charge held by the tablet or the battery of the tablet may be increased without increasing the size of the tablet or the tablet housing. In turn, this also enhances the user experience. In some implementations, the flexible housing may include a flexible display device. For example, the flexible housing may be for a bendable tablet having a bendable display device (e.g., touchscreen)

Figure 1A:
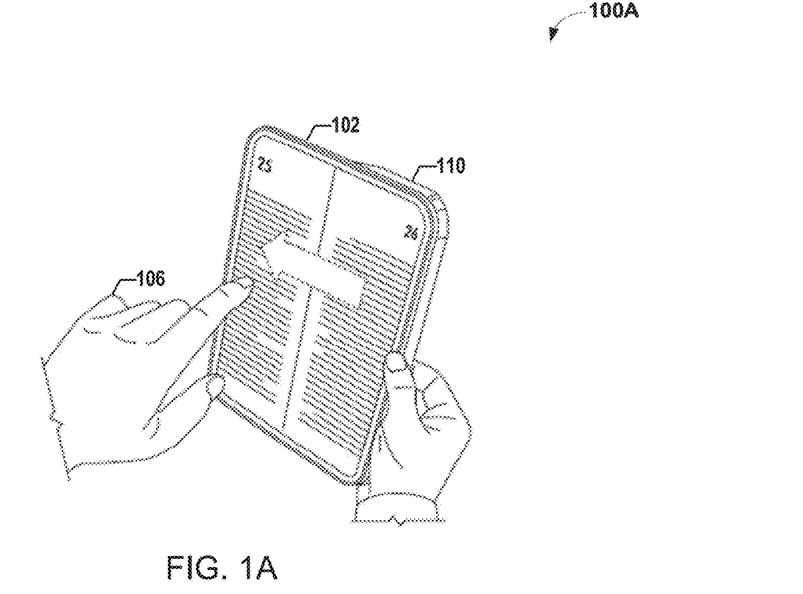
FIGS. 1A-1B illustrate an environment where one or more devices may operate in accordance with one or more example embodiments of the disclosure.

FIG. 1A illustrates an environment 100A where one or more devices may operate in accordance with one or more example embodiments of the disclosure. FIG. 1A depicts a tablet 102. In one implementation, the tablet 102 may include an ergonomic grip 110. A user may hold the tablet 102 using the ergonomic grip 110. In some implementations, the ergonomic grip 110 may contain one or more buttons configured to receive user input. In some examples, the tablet 102 may be used as an E-reader to read or view a book. The user may provide user input 106 to cycle or flip through pages. For example, the user may swipe across a touchscreen (forward or backwards) to flip through pages as shown in FIG. 1A. However, swiping across the touchscreen may be cumbersome when the user desires to flip through pages quickly.

Figure 1B:
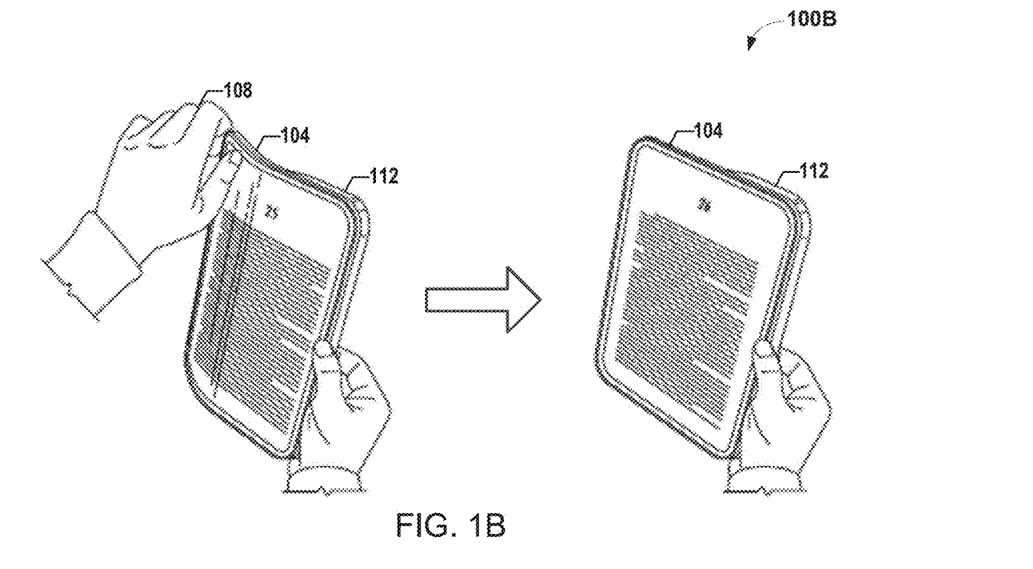

FIG. 1B illustrates an environment 100B where one or more devices may operate in accordance with one or more example embodiments of the disclosure. FIG. 1B depicts a flexible bendable tablet 104. The flexible bendable tablet 104 may include an ergonomic grip 112. The ergonomic grip 112 may house or include, at least a portion of, a flexible bendable battery (not shown). The flexible bendable battery may be configured to bend in the direction depicted in FIG. 1B. In one implementation, the flexible bendable battery may be thicker within the portion of the tablet housing that includes the ergonomic grip 112 than in a portion of the tablet housing that does not include the ergonomic grip 112. For example, the battery may be thinner at the depicted bent portion of the tablet. The user may provide user input 108 via bending the tablet 104. The user input 108 may cause the tablet to display the next page of the book. In some implementations, bending the tablet 104 or holding the tablet in the bent position cause pages of the book to be displayed quickly and consecutively in succession. Similarly, straightening or unbending the tablet 104 may cause the consecutive display to be halted. For example, the tablet may remain displaying a current page. In some implementations, a tablet may be configured to receive and process user inputs similar to user input 106 and/or user input 108. For example, in such an implementation, a user may be able to flip through pages by providing either user input 106 or user input 108.

The tablet 102 and/or the tablet 104 may include one or more monitoring modules (e.g., sensors). The monitoring module may be configured to monitor the flexible battery. For example, the monitoring module may monitor the pressure of or within the flexible battery. The monitored pressure may be compared to a pressure threshold (e.g., 5 psi, 10 psi, 15 psi, 20 psi, 25 psi and/or the like). The pressure threshold may be defined by a maximum pressure that the battery may withstand while being bent. For example, a threshold of 20 psi may be specified. Once the battery pressure exceeds 20 psi, the monitoring module may provide a warning to the tablet 104. The tablet 104 may in turn display a warning. In some implementations, the tablet 104 may mechanically prevent the bending of the tablet 104 in response to the monitoring module determining that the pressure of the battery exceeds the threshold. For example, the housing may include one or more springs that prevent the bending of the tablet 104 in particular directions and/or in any direction. In one implementation, the springs may prevent the tablet from being bent in directions other than a particular direction selected by design. In some implementations, the springs may be activated mechanically to prevent the tablet 104 from being bent in response to determining by the monitoring module that the pressure of the battery exceeds the threshold discussed above. Other mechanical elements may be used to prevent the bending of the tablet 104. For example a sliding rod may be engaged and disengaged electronically to prevent or allow bending of tablet 104. For example, as the rod is retracted the tablet 104 may be bendable. However, when the rod is engaged the tablet 104 may be rigid or unbendable. In a different example, a ratchet like component may allow mechanical slip in at least one direction and prevent mechanical slip in at least one other direction. For example, the ratchet like component may allow mechanical slip in a first direction and prevent mechanical slip in all other directions.

Figure 3A:
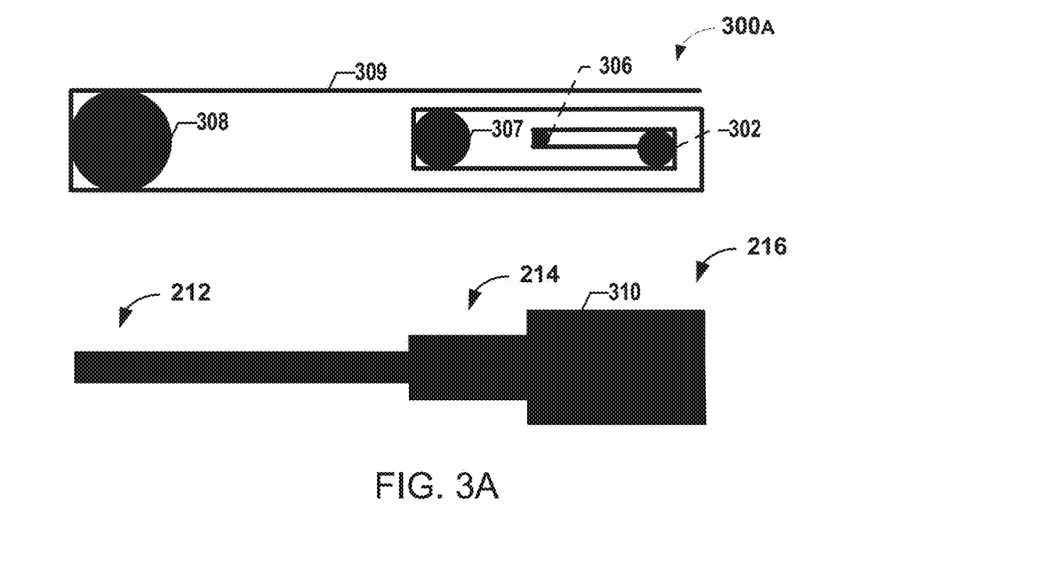
FIGS. 3A-3B illustrate example processes for manufacturing a device according to one or more example embodiments of the disclosure.
Figure 3B:
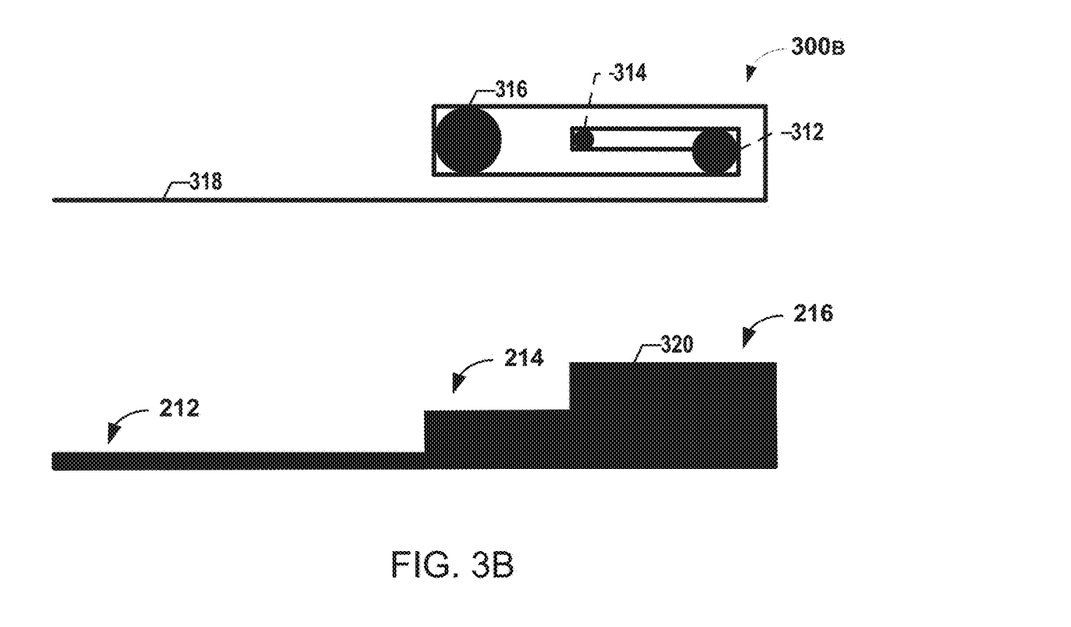

In some embodiments, the thickness of the battery may dictate whether the battery is bendable. Therefore, the battery may be manufactured such that the battery is thinner at a bendable portion of the battery than at an opposing portion of the battery. For example, the battery may be thicker at the ergonomic grip portion than at the opposing bendable portion. In one implementation, the battery may be manufactured by a stacking technique. In a different implementation, the battery may be manufactured by a winding technique for winding a battery laminate and/or strip. In some implementations, a plurality of mandrels may be used to wind the battery. The mandrels may be arranged such that the when the battery is wound, the battery is thicker at a first portion than at a second portion. FIGS. 3A-3B depict some example mandrel configurations for winding a battery according to the above parameters.

Illustrative Device Architecture

Embodiments of the present disclosure may be implemented in various ways, including as computer program products that comprise articles of manufacture. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, computer program products, program code, and/or similar terms used herein interchangeably). Such non-transitory computer-readable storage media includes all computer-readable media (including volatile and non-volatile media).

In one embodiment, a non-volatile computer-readable storage medium may include a floppy disk, flexible disk, hard disk, solid-state storage (SSS) (e.g., a solid state drive (SSD)), solid state card (SSC), solid state module (SSM), enterprise flash drive, magnetic tape, or any other non-transitory magnetic medium, and/or the like. A non-volatile computer-readable storage medium may also include a punch card, paper tape, optical mark sheet (or any other physical medium with patterns of holes or other optically recognizable indicia), compact disc read only memory (CD-ROM), compact disc-rewritable (CD-RW), digital versatile disc (DVD), Blu-ray disc (BD), any other non-transitory optical medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMCs), secure digital (SD) memory cards, SmartMedia cards, CompactFlash (CF) cards, memory sticks or memory apparatus, and/or the like. Further, a non-volatile computer-readable storage medium may also include conductive-bridging random access memory (CBRAM), phase-change random access memory (PRAM), ferroelectric random-access memory (FeRAM), non-volatile random-access memory (NVRAM), magnetoresistive random-access memory (MRAM), resistive random-access memory (RRAM), Silicon-Oxide-Nitride-Oxide-Silicon memory (SONGS), floating junction gate random access memory (FJG RAM), Millipede memory, racetrack memory, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor IUM (TTRAM), Thyristor RAM (T-RAM), Zero-capacitor (Z-RAM), Rambus in-line memory module (RIMM), dual in-line memory module (DIMM), single in-line memory module (SIMM), video random access memory (VRAM), cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present disclosure may also be implemented as methods, apparatus, systems, computing devices, computing entities, and/or the like. As such, embodiments of the present disclosure may take the form of an apparatus, system, computing device, computing entity, and/or the like executing instructions stored on a computer-readable storage medium to perform certain steps or operations. Thus, embodiments of the present disclosure may also take the form of an entirely hardware embodiment, an entirely computer program product embodiment, and/or an embodiment that comprises a combination of computer program products and hardware performing certain steps or operations.

Embodiments of the present disclosure are described below with reference to block diagrams and flowchart illustrations. Thus, it should be understood that each block of the block diagrams and flowchart illustrations may be implemented in the form of a computer program product, an entirely hardware embodiment, a combination of hardware and computer program products, and/or apparatus, systems, computing devices, computing entities, and/or the like carrying out instructions, operations, steps, and similar words used interchangeably (e.g., the executable instructions, instructions for execution, program code, and/or the like) on a computer-readable storage medium for execution. For example, retrieval, loading, and execution of code may be performed sequentially such that one instruction is retrieved, loaded, and executed at a time. In some exemplary embodiments, retrieval, loading, and/or execution may be performed in parallel such that multiple instructions are retrieved, loaded, and/or executed together. Thus, such embodiments can produce specifically-configured machines performing the steps or operations specified in the block diagrams and flowchart illustrations. Accordingly, the block diagrams and flowchart illustrations support various combinations of embodiments for performing the specified instructions, operations, or steps.

Bendable Device and Battery

Figure 2A:
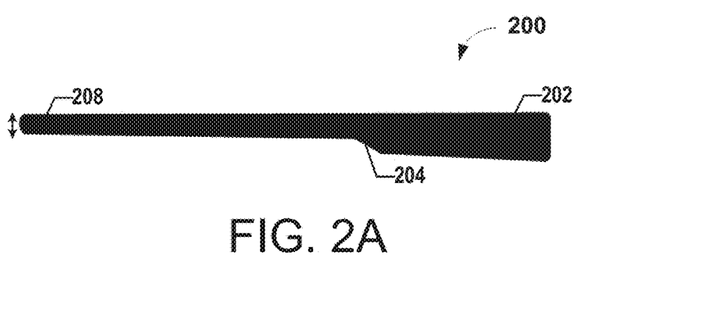
FIGS. 2A-2C illustrate example views of a device according to one or more example embodiments of the disclosure.
Figure 2B:
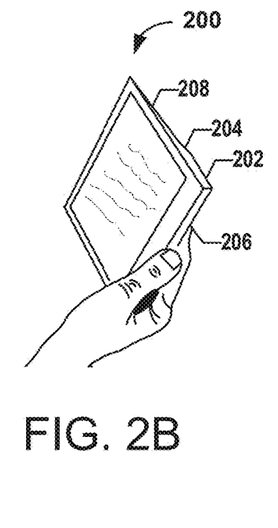
Figure 2C:
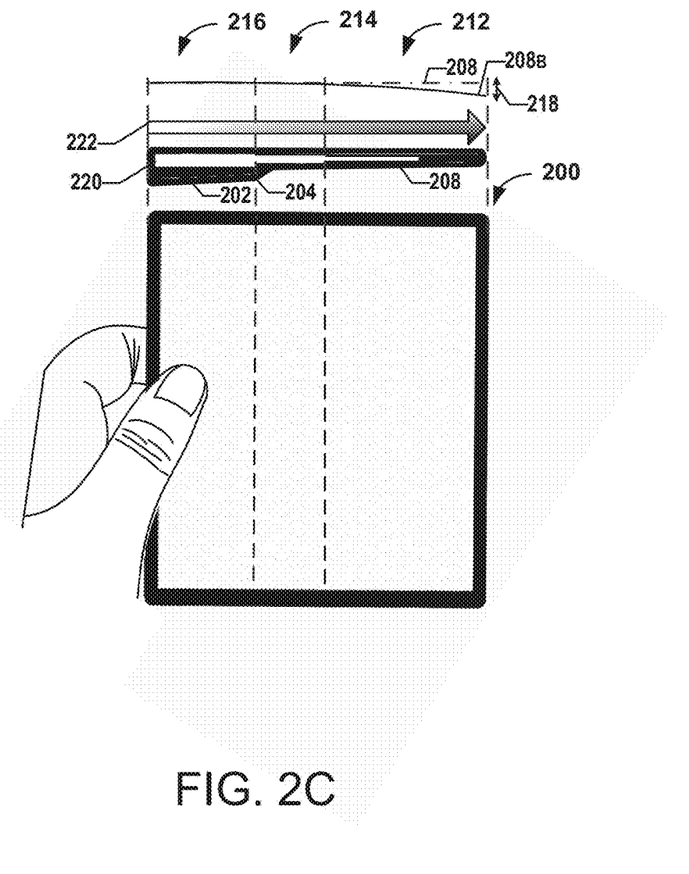

FIGS. 2A-2C illustrate example perspective and cross-sectional views of a device 200 according to one or more example embodiments of the disclosure. The device 200 may be, for example, a tablet. The device 200 may include a flexible display device or element for viewing pages containing textual data and/or graphical data. The flexible display device or element may be bendable. The device 200 may also include a grip portion 202, a tapered portion 204 and a bendable portion 208. The grip portion 202 may include an ergonomic grip for holding the device. In some implementation, the device 200 may include one or more buttons 206 for receiving user interactions. The buttons, for example, may allow for changing the volume of the device, scrolling through pages and/or the like.

With reference to FIG. 2C, the device 200 is divided into 3 different portions or sections defined by the vertical lines shown in phantom. The first section 216 includes the ergonomic grip portion 202. In some implementations, at least a portion of a battery 220 is enclosed within the ergonomic grip portion 202. In some implementations, the portion of the battery 220 within the section 216 is thicker than the battery portions in sections 214 and 212. Given that the battery thickness and the grip portion 202 thickness are highest in section 216, section 216 is rigid or unbendable. As used herein, the term unbendable may denote that the portion is not flexible or cannot be bent under normal operational conditions (e.g., cannot be bent with a force within the threshold range of normal operational conditions).

Section 214 includes the tapered portion 204. As the thickness of the tablet decreases within the section 214, less area is available for occupation by the battery 220. As seen in FIG. 2C, the battery 220 at section 214 is thinner than the battery 220 at section 216 and thicker than the battery 220 at section 212. Again, based on the thickness of section 214, the section 214 is somewhat rigid. For example, section 214 may be less rigid than section 216 but more rigid than section 212. In one implementation, section 214 may be unbendable. In a different implementation, section 214 may be somewhat bendable. Yet in other implementations, section 214 may be bendable.

Section 212 includes the bendable portion 208. The battery 220 is thinnest at portion 212. Accordingly, section 212 is more flexible than sections 216 and 214. The bendable housing at the bendable portion 208 is more flexible because it is generally thinner than other portions of tablet 200. Similarly, the battery 220 within the section 212 is thinner than the battery portions at sections 216 and 214. Therefore, the section 212 is more flexible and bendable in a particular direction. The bendable portions 208 and/or 212 may be bent in the direction depicted in FIG. 1B. With reference to FIG. 2C, the baseline 208 denotes the tablet at rest (e.g., unbent, no external force applied and/or the like). The curve 208B shows the bending of the device 200 in the particular direction and denotes the maximum allowable bend displacement 218. The bend displacement 218 may be defined in distance. For example the bend displacement 218 may be 0.1 in, 0.2 in, 0.4 in, 0.5 in, 1 in, 2 in and/or the like. In some implementations, the device 200 may only be bent in the depicted direction. The maximum bend displacement 218 may be determined based on, for example, the battery and the design parameters of the battery. A bend determination module may monitor the bending of the device 200. The bend determination module may comprise one or more sensors and may determine the bend displacement of the device 200. In some implementations, the battery may be designed to support a large bending displacement 218 safely. The battery 220 may be designed to withstand the pressure associated with bending the battery 220 accordingly. In other implementations, the battery 220 may be designed to withstand less pressure associated with bending the battery 220 in order to reduce the manufacturing cost of the battery. It should be understood that the battery may be designed to accommodate different features and parameters.

FIG. 2C also shows the rigidity of the device 200 in association with the location on the device in grayscale 222. As shown the device is very rigid on the left side (ergonomic grip side) and gradually gets more flexible as the device is traversed towards the bendable portion 208 (bendable side). According to the above, a user may bend the battery and the device 200 at section 212 in order to interact with the device 200. For example, the user may bend the device 200 via user input 108 to flip through pages. In some implementations, the device 200 may be the tablet 104. The user input 108 may cause the tablet 104 to display the next page of a book. In some implementations, bending the tablet 104 or holding the tablet in the bent position causes the pages of the book to be displayed quickly and consecutively in succession. Similarly, straightening or unbending the tablet 104 may cause the consecutive display to be halted. For example, the tablet may remain displaying a current page in response to be being straightened or unbent. In some implementations, a tablet may be configured to receive and process user inputs similar to user input 106 and/or user input 108 as described above. For example, in such an implementation, a user may be able to flip through pages by providing either user input 106 or user input 108.

The device 200 may include one or more monitoring modules (e.g., sensors). The monitoring module may be configured to monitor the battery 220. For example, the monitoring module may monitor the pressure of or within the battery. The monitored pressure may be compared to a pressure threshold (e.g., 5 psi, 10 psi, 15 psi, 20 psi, 25 psi and/or the like). The pressure threshold may be defined by a maximum threshold that the battery may withstand while being bent. For example, 20 psi may be the threshold. Once the battery 220 pressure exceeds 20 psi, the monitoring module may provide a warning to the device 200. The device 200 may in turn display a warning. In some implementations, the device 200 may mechanically prevent the bending of the device 200 in response to the monitoring module determining that the pressure of the battery exceeds the threshold.

In general, the terms processing device, computer, entity, system, and/or similar words used herein interchangeably may refer to, for example, one or more computers, computing entities, desktop computers, mobile phones, tablets, phablets, notebooks, laptops, distributed systems, gaming consoles, watches, televisions, dongles, servers or server networks, blades, gateways, switches, processing devices, processing entities, set-top boxes, the like, and/or any combination of devices or entities adapted to perform the functions, operations, and/or processes described herein. Such functions, operations, and/or processes may include, for example, transmitting, receiving, operating on, processing, displaying, storing, determining, creating/generating, monitoring, evaluating, comparing, and/or similar terms used herein interchangeably. In one embodiment, these functions, operations, and/or processes can be performed on data, content, information, and/or similar terms used herein interchangeably. Although the operations described herein may be described with reference to the device 200 and/or battery 220, such operations may be performed by other suitable devices, such as the devices discussed above.

Figure 4A:
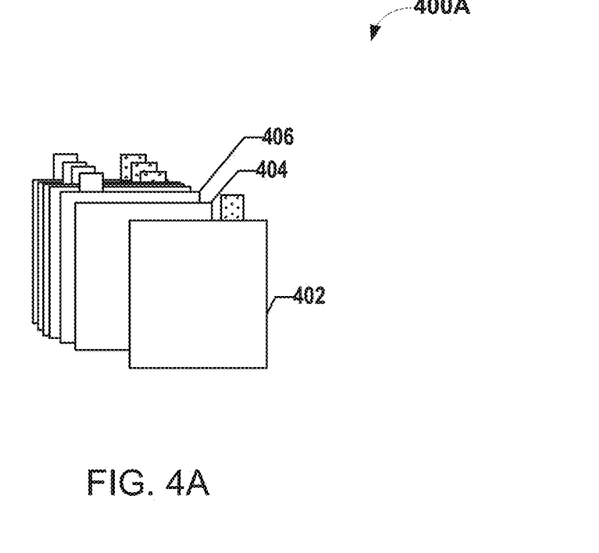
FIGS. 4A-4B illustrate example processes for manufacturing a device according to one or more example embodiments of the disclosure.

FIGS. 3A-3B and 4A-4B relate to manufacturing a battery according to one or more embodiments of the disclosure. The flexible battery may be for example a pouch battery. The flexible battery may be, for example, manufactured using a stacking technique or a wrapping technique. Stacking techniques generally stack elements of the battery on top of one another during manufacturing. Wrapping techniques generally wrap elements of the battery around into a roll like structure. FIG. 4A illustrates an example of manufacturing a battery according to a stacking technique. Using the stacking technique, a cathode 406 may be placed in a first stack. A separator or a separator sheet 404 may be placed or stacked on top of the cathode 406. In turn, an anode 402 may be placed or stacked on top of the separator or separator sheet 404. A second separator sheet is then stacked or placed on the anode 402, followed by a second cathode. The process continues until the stack reaches a desired size.

Figure 4B:
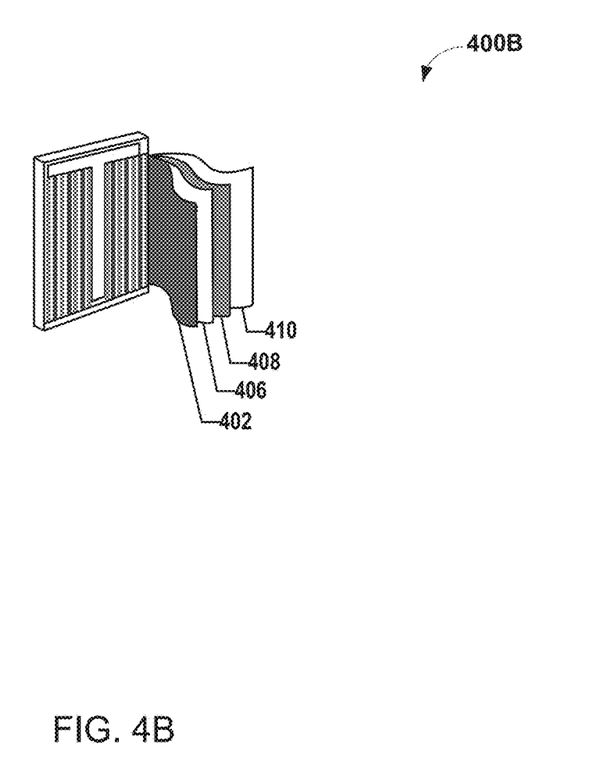

FIG. 4B illustrates the manufacturing of a battery according to a wrapping technique. Battery elements (e.g., cathodes, anodes, separators) are manufactured in a contiguous manner such that when the elements are wrapped or wound around one or more mandrels create a stack similar to the stack of FIG. 4A. FIG. 4B depicts how elements of the battery 220 are wound using a winding technique for winding a battery laminate or strip. The battery 220 may include an anode layer 402 wound around a mandrel or itself, and a separator 406 wound around the anode layer 402. A cathode layer 408 may be wound around the separator 406 and a second separator 410 may be wound around cathode layer 408.

In order to achieve the stepped design of the battery 220 or similar stepped designs, batteries may be manufactured using a winding technique as described. However, the battery is wound over a particular configuration of mandrels in order to ensure that the battery has a different thickness at different portions. FIGS. 3A-3B depict example configurations of mandrels for winding a battery having at least two portions in which each portion has a different thickness (stepped design).

FIG. 3A depicts a battery design 310 and a winding process 300A for manufacturing the battery design 310. The winding process 300A begins at mandrel 302. The battery elements 309 (e.g., cathode, separator, anode, separator, etc.) are wound around the mandrel 302 followed by the mandrel 306. In one example, the mandrel 302 may also act as a clamp for holding the wound layers together and initiating the winding process of a battery laminate or strip. In one implementation, the mandrel 302 may include a slit for securing the cathode/anode/separator material that is to be wound. In some implementations, the mandrel 302 may be a spool or a bobbin or the like. Note that the mandrels may be of different sizes. In turn, the battery elements 309 may be wound again around the mandrel 302 then wound around the mandrel 307. Finally, the battery elements 309 may be wound around the mandrel 308. It is important to note that at a right side of the battery (section 212), the battery includes six layers while at a left side the battery includes only two layers. After the battery is wound, the mandrels 302, 306, 307, and 308 are removed. When the mandrels are removed, the battery is flattened. For example the battery may be flattened via cold pressing, hot pressing or the like to create stack pressure and maintain the desired battery shape. In some implementations, the shape of the press may be similar to the shape of the batteries 310 or 320. The thickness of the battery at each portion is dictated by the number of layers included in each portion. Therefore the battery is thicker at section 216 than in sections 214 and 212. Similarly, the battery is thinner in section 212 than in sections 214 and 216, Finally, the battery thickness at section 214 is between the battery thickness at sections 216 and 212. According to the mandrel configuration above, the battery design 310 is achieved.

FIG. 3B depicts a battery design 320 and a winding process 300B for manufacturing the battery design 320. The winding process 300B begins at mandrel 312. In one example, the mandrel 312 may also act as a clamp for holding the wound layers together and initiating the winding process. In one implementation, the mandrel 312 may include a slit for securing the cathode/anode/separator material that is to be wound. In some implementations, the mandrel 312 may be a spool or a bobbin or the like. The battery elements 318 (e.g., cathode, separator, anode, separator, etc.) are wound around the mandrel 312 followed by the mandrel 314. Note that the mandrels may be of different sizes. In turn, the battery elements 318 may be wound again around the mandrel 312 then wound around the mandrel 316. Finally, the battery elements 318 may be extended in a single layer to section 216. It is important to note that at a right side of the battery (section 212), the battery includes five layers while at a left side the battery includes only a single layer. After the battery is wound the mandrels 312, 314, 316 are removed. When the mandrels are removed, the battery is flattened as described above. The thickness of the battery at each portion is dictated by the number of layers included in each portion. Therefore the battery is thicker at section 216 than in sections 214 and 212. Similarly, the battery is thinner in section 212 than sections 214 and 216. Finally, the battery thickness at section 214 is between the battery thickness at sections 216 and 212. According to the mandrel configuration above, the battery design 320 is achieved.

It should be understood that the winding and mandrel configurations discussed above are example embodiments. Other configurations that result in a stepped battery or a battery that has at least a first thickness at a first portion and a second thickness at a second portion. Naturally, additional portion having different thickness may also be included in the battery. Also, stepped batteries may be designed and manufactured to fit different size constraints. For example, the grip portion described above where a portion of the battery is located may have different shapes and sizes. In one implementation, the grip portion may be cylindrical. The methods and systems above provide for increasing the utilization of space in such locations having different shapes and sizes, by increasing the size of the battery within such locations. In some implementations, the stepped battery may manufacture as a single contiguous battery. In other implementations, the stepped battery may be manufactured as multiple non-contiguous portions.

Computing Device

Figure 5:
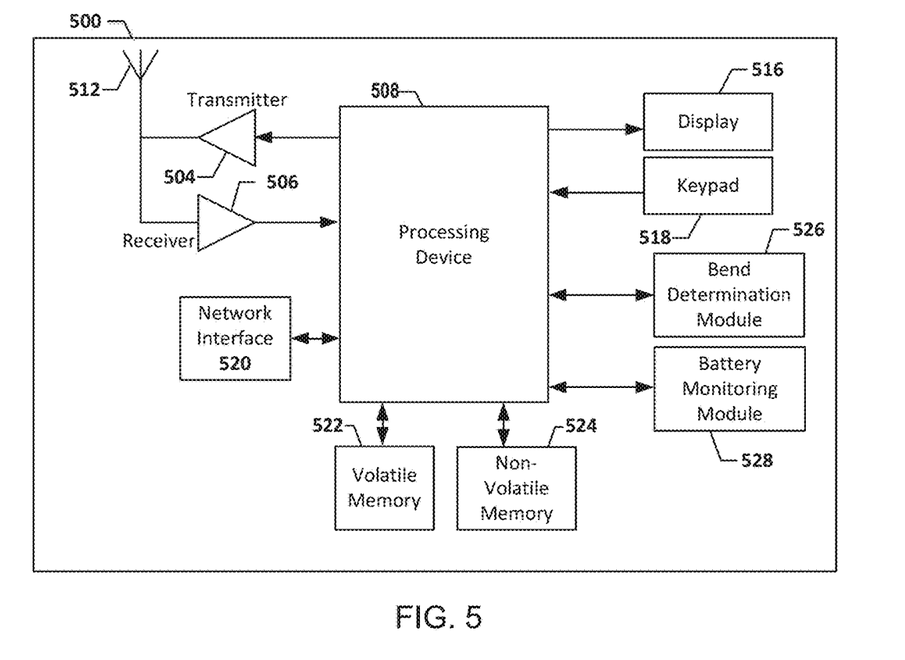
FIG. 5 illustrates an example schematic diagram of a computing device or entity according to one or more example embodiments of the disclosure.

FIG. 5 illustrates an example schematic diagram of a computing device 500 and/or entity according to one or more example embodiments of the disclosure. In general, the computing device, computer, entity, system, and/or similar words used herein interchangeably may refer to, for example, one or more computers, computing entities, desktops, mobile phones, tablets, phablets, notebooks, laptops, distributed systems, gaming consoles (e.g., Xbox, Play Station, Wii), watches, glasses, key fobs, radio frequency identification (RFID) tags, ear pieces, scanners, cameras, wristbands, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. Computing device 500 can be operated by various parties and/or automatically. As shown in FIG. 5, the computing device 500 can include an antenna 512, a transmitter 504 (e.g., radio), a receiver 506 (e.g., radio), and a processing device 508 (e.g., CPLDs, microprocessors, multi-core processors, coprocessing entities, ASIPs, microcontrollers, and/or controllers) that provides signals to and receives signals from the transmitter 504 and the receiver 506, respectively.

The signals provided to and received from the transmitter 504 and the receiver 506, respectively, may include signaling information in accordance with air interface standards of applicable wireless systems. In this regard, the computing device 500 may be capable of operating with one or more air interface standards, communication protocols, modulation types, and access types. More particularly, the computing device 500 may operate in accordance with any of a number of wireless communication standards and protocols. In a particular embodiment, the computing device 500 may operate in accordance with multiple wireless communication standards and protocols, such as UMTS, CDMA2000, 1xRTT, WCDMA, TD-SCDMA, LTE, E-UTRAN, EVDO, HSPA, FISDPA, Wi-Fi, Wi-Fi Direct, WiMAX, UWB, IR, NFC, Bluetooth, USB, and/or the like. Similarly, the computing device 500 may operate in accordance with multiple wired communication standards and protocols, via a network interface 520.

Via these communication standards and protocols, the computing device 500 can communicate with various other entities using concepts such as Unstructured Supplementary Service Data (USSD), Short Message Service (SMS), Multimedia Messaging Service (MMS), Dual-Tone Multi-Frequency Signaling (DTMF), and/or Subscriber Identity Module Dialer (SIM dialer). The computing device 500 can also download changes, add-ons, and updates, for instance, to its firmware, software (e.g., including executable instructions, applications, program modules), and operating system.

According to one embodiment, the computing device 500 may include location determining aspects, devices, modules, functionalities, and/or similar words used herein interchangeably. For example, the computing device 500 may include outdoor positioning aspects, such as a location module adapted to acquire, for example, latitude, longitude, altitude, geocode, course, direction, heading, speed, universal time (UTC), date, and/or various other information/data. In one embodiment, the location module can acquire data, sometimes known as ephemeris data, by identifying the number of satellites in view and the relative positions of those satellites. The satellites may be a variety of different satellites, including Low Earth Orbit (LEO) satellite systems, Department of Defense (DOD) satellite systems, the European Union Galileo positioning systems, the Chinese Compass navigation systems, Indian Regional Navigational satellite systems, and/or the like. Alternatively, the location information can be determined by triangulating the user computing device 500 position in connection with a variety of other systems, including cellular towers, Wi-Fi access points, and/or the like. Similarly, the computing device 500 may include indoor positioning aspects, such as a location module adapted to acquire, for example, latitude, longitude, altitude, geocode, course, direction, heading, speed, time, date, and/or various other information/data. Some of the indoor systems may use various position or location technologies including RFIM tags, indoor beacons or transmitters, Wi-Fi access points, cellular towers, nearby computing devices (e.g., smartphones, laptops) and/or the like. For instance, such technologies may include the iBeacons, Gimbal proximity beacons, Bluetooth Low Energy (BLE) transmitters, NFC transmitters, and/or the like. These indoor positioning aspects can be used in a variety of settings to determine the location of someone or something to within inches or centimeters.

The computing device 500 may also comprise a user interface (that can include a display 516 coupled to a processing device 508) and/or a user input interface (coupled to a processing device 508). For example, the user interface may be a user application, browser, user interface, and/or similar words used herein interchangeably executing on and/or accessible via the computing device 500 to interact with and/or cause display of information. The user input interface can comprise any of a number of devices or interfaces allowing the computing device 500 to receive data, such as a keypad 518 (hard or soft), a touch display, voice/speech or motion interfaces, or other input devices. In embodiments including a keypad 518, the keypad 518 can include (or cause display of) the conventional numeric (0-9) and related keys (#, *), and other keys used for operating the computing device 500 and may include a full set of alphabetic keys or set of keys that may be activated to provide a full set of alphanumeric keys. In addition to providing input, the user input interface can be used, for example, to activate or deactivate certain functions, such as screen savers and/or sleep modes.

The computing device 500 can also include volatile memory 522 and/or non-volatile memory 524, which can be embedded and/or may be removable. For example, the non-volatile memory may be ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like. The volatile and non-volatile memory can store databases, database instances, database management systems, data, applications, programs, program modules, scripts, source code, object code, byte code, compiled code, interpreted code, machine code, executable instructions, and/or the like to implement the functions of the computing device 500, As indicated, this may include a user application that is resident on the respective device or accessible through a browser or other user interface for communicating with various other computing entities.

A bend determination module 526 may monitor the bending of the device 200. In one implementation, the bend determination module may comprise one or more distance measuring sensors and may determine the bend displacement of the device 200. In one implementation, the bend determination module may comprise one or more force measuring sensors and may determine the force applied onto device 200 during the bending. The bend determination module may provide the bend displacement measurements and/or the force measurements to processing device 508. In turn, the processing device 508 may determine whether to change the page currently displayed. Similarly, the processing device 508 may determine a rate of displaying consecutive pages (e.g., speed of flipping through pages) based on the bend displacement and/or the applied force. The processing device 508 may then provide instructions to the display device 516 accordingly.

In some implementations, the battery may be designed to support a large bending displacement 218 safely. In some implementations, the battery may be designed to withstand a large applied force for bending the device 200. The battery 220 may be designed to withstand the pressure associated with bending the battery 220 accordingly. In other implementations, the battery 220 may be designed to withstand less pressure associated with bending the battery 220 in order to reduce the manufacturing cost of the battery. It should be understood that the battery may be designed to accommodate different features and parameters. A battery monitoring module 528 may monitor the overall status of the battery 220 to monitor the performance of the battery. As will be recognized, the above architectures and descriptions are provided for example purposes only and are not limiting to the various embodiments described herein.

Illustrative Processes

Figure 6:
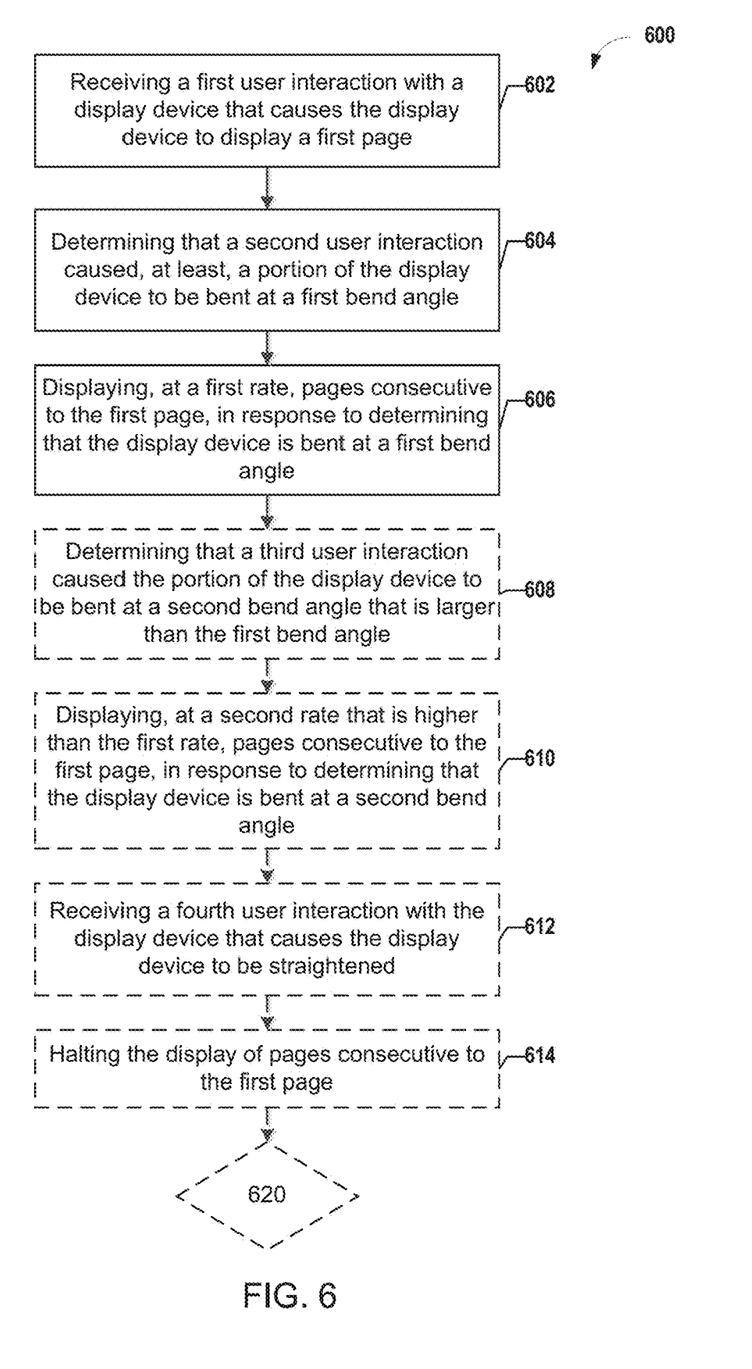
FIGS. 6-7 are flowcharts illustrating various procedures and operations that may be completed in accordance with various embodiments of the disclosure.

FIG. 6 is a flowchart of an example process 600 in accordance with various embodiments of the disclosure. The process 600 may begin with receiving a first user interaction with a display device that causes the display device to display a first page (602). In one implementation, the display device may be an E-reader or a tablet. For example, a user may interact with the E-reader or the tablet to view a first page of a book. In one implementation, the user may utilize a touchscreen of the E-reader or the tablet to select a book and a page of the book to view.

The process 600 may continue with determining that a second user interaction caused, at least, a portion of the display device to be bent at a first bend angle (604). For example, the user may bend the display device in a first direction. A sensor and/or a module may determine the bending angle of the display device and the force applied onto the display device. In turn, the process 600 may continue with displaying, at a first rate, pages consecutive to the first page, in response to determining that the display device is bent at a first bend angle (606). For example, the E-reader or tablet may simulate flipping through consecutive pages of the book based on determining that one end of the E-reader or tablet is bent in a particular direction. In one implementation, each bending motion may cause a single page to be flipped. In a different implementation, a user may hold the bending motion to flip through a plurality of pages. A bend determination module may monitor user interactions that bend the display device. The bend deamination module may determine the bend displacement described above and/or the force applied onto the display device.

The process 600 may continue with optional step 608, shown in phantom. The process 600 may continue with determining that a third user interaction caused the portion of the display device to be bent at a second bend angle that is larger than the first bend angle (608). For example, the user may bend the E-reader or tablet further in the first direction. A sensor and/or a module may determine the bending angle of the display device and the force applied onto the display device. For example, the sensor and/or the module may determine that the bending angle increased.

Similarly, the sensor and/or the module may determine that the bending force increased. In turn, the process 600 continue with, with optional step 610, by displaying, at a second rate that is higher than the first rate, pages consecutive to the first page, in response to determining that the display device is bent at a second bend angle (610). For example, responsive to determining the either the bending force increased or that the bending angle increased, the E-reader or tablet may display consecutive pages of the book at a higher rate and/or faster speed. In one example, the user may bend the E-reader or tablet further in order to flip through pages at a higher pace.

The process 600 may continue with the optional step 612. The process 600 may continue with receiving a fourth user interaction with the display device that causes the display device to be straightened (612). For example, the user may stop bending the E-reader or the tablet. The process 600 may then end with the optional step 614. The process 600 may end with halting the display of pages consecutive to the first page (614). For example, the reader or the tablet may stop or halt flipping through the consecutive pages, in response to the user stopping the bending of the E-reader or the tablet. Similarly, the E-reader or the tablet may determine that the user reduced the bending force applied onto the E-reader or tablet or that the angle of bend decreased. In turn, the F-reader or tablet may reduce the rate or speed of displaying consecutive pages.

Figure 7:
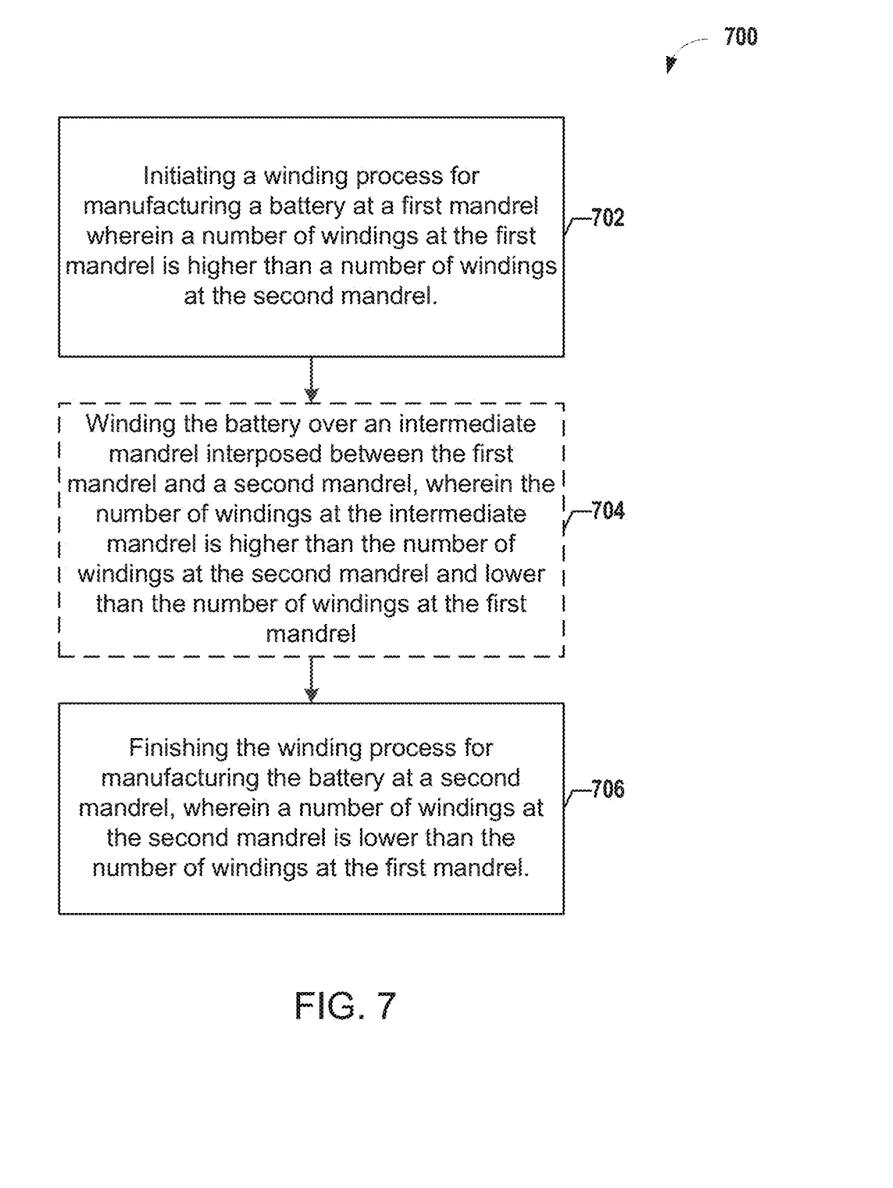

The process 600 may optionally continue with the process 700.

FIG. 7 is a flowchart of an example process 700 for manufacturing a battery in accordance with various embodiments of the disclosure. The process 700 may begin with initiating a winding process, for manufacturing a battery, at a first mandrel wherein a number of windings at the first mandrel is higher than a number of windings at the second mandrel (702). For example, the process 700 may begin with winding a layer containing battery elements (e.g., anode, separator, cathode, separator and/or the like) around a first mandrel, as shown for example in FIGS. 3A-3B and 4B. In one implementation, the windings around the first mandrel are more than the windings around a second and an intermediate mandrel.

The process 700 may optionally continue with step 704. The process 700 may continue with winding the battery over an intermediate mandrel interposed between the first mandrel and a second mandrel, wherein the number of windings at the intermediate mandrel is higher than the number of windings at the second mandrel and lower than the number of windings at the first mandrel (704). For example, a number of windings around the first mandrel may be higher than the number of windings at the intermediate mandrel. In some implementations, the battery may be thicker in a portion surrounding the first mandrel than in a portion surrounding the intermediate mandrel.

The process 700 may then end with finishing the winding process for manufacturing the battery at a second mandrel, wherein a number of windings at the second mandrel is lower than the number of windings at the first mandrel (706). For example, similar to the description above, the portion of the battery surrounding the second mandrel may be thinner than the portion surrounding the first mandrel and the portion surrounding the intermediate mandrel. Accordingly, the battery is tapered in shape. For example, the battery may be wedge shaped or a step triangle shape (thicker on one end gradually becomes thinner towards an opposite end). Naturally, additional intermediate mandrels may be added to create a smoother wedge shaped battery.

In some implementations, batteries may be coated after completion of the flattening process. In one implementation, coating may be applied to the battery to increase the stiffness of the battery. In some implementations, the non-bendable portions of the battery are coated with more coating than the bendable portions of the battery. For example, the battery portion at section 216 may be coated with more coating than sections 214 and 212. Similarly, the section 214 may be coated with less coating than section 216 but more coating than section 212.

It should be understood that the processes, operations, and functionality described above may be performed by or implemented in or by a plurality of systems. For example, the processes, operations, and functionality above may be implemented in batteries, battery powered electronic devices, remote management systems, computing entities, and/or the like. The processes, operations, and functionality may be applied to batteries during operation and/or manufacturing.

It should be noted that the methods above may be modified in various ways in accordance with certain embodiments of the disclosure. For example, one or more operations of the methods above may be eliminated or executed out of order in other embodiments of the disclosure. Additionally, other operations may be added to the methods above in accordance with other embodiments of the disclosure.

Additional Implementation Details

Although an example processing system and/or device has been described above, implementations of the subject matter and the functional operations described herein can be implemented in other types of digital electronic circuitry, or in computer software, firmware, or hardware, including the structures disclosed in this specification and their structural equivalents, or in combinations of one or more of them.

Embodiments of the subject matter and the operations described herein can be implemented in digital electronic circuitry, or in computer software, firmware, or hardware, including the structures disclosed in this specification and their structural equivalents, or in combinations of one or more of them. Embodiments of the subject matter described herein can be implemented as one or more computer programs, i.e., one or more modules of computer program instructions, encoded on a computer storage medium for execution by, or to control the operation of, information/data processing apparatus. Alternatively, or in addition, the program instructions can be encoded on an artificially generated propagated signal, e.g., a machine-generated electrical, optical, or electromagnetic signal, which is generated to encode information/data for transmission to a suitable receiver apparatus for execution by an information/data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described herein can be implemented as operations performed by an information/data processing apparatus on information/data stored on one or more computer-readable storage devices or received from other sources.

The term "data processing apparatus" encompasses all kinds of apparatus, devices, and machines for processing data including, by way of example, a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing, and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or information/data (e.g., one or more scripts stored in a markup language document), in a single file dedicated to the program in question, or in multiple coordinated files (e.g., files that store one or more modules, subprograms; or portions of code). A computer program can be deployed to be executed on one computer or on multiple computers that are located at one site or distributed across multiple sites and interconnected by a communication network.

The processes and logic flows described herein can be performed by one or more programmable processors executing one or more computer programs to perform actions by operating on input information/data and generating output. Processors suitable for the execution of a computer program include, by way of example, both general and special purpose microprocessors, and any one or more processors of any kind of digital computer. Generally, a processor will receive instructions and information/data from a read-only memory or a random access memory or both. The essential elements of a computer are a processor for performing actions in accordance with instructions and one or more memory devices for storing instructions and data. Generally, a computer will also include, or be operatively coupled to receive information/data from or transfer information/data to, or both, one or more mass storage devices for storing data, e.g., magnetic, magneto-optical disks, or optical disks. However, a computer need not have such devices. Devices suitable for storing computer program instructions and information/data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described herein can be implemented on a computer having a display device, e.g., a CRT (cathode ray tube) or LCD (liquid crystal display) monitor, for displaying information/data to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described herein can be implemented in a computing system that includes a back-end component, e.g., as an information/data server, or that includes a middleware component, e.g., an application server, or that includes a front-end component, e.g., a client computer having a graphical user interface or a web browser through which a user can interact with an implementation of the subject matter described herein, or any combination of one or more such back-end, middleware, or front-end components. The components of the system can be interconnected by any form or medium of digital information/data communication, e.g., a communication network. Examples of communication networks include a local area network (LAN) and a wide area network (WAN), an inter-network (e.g., the Internet), and peer-to-peer networks (e.g., ad hoc peer-to-peer networks).

The computing system can include clients and servers. A client and server are generally remote from each other and typically interact through a communication network. The relationship of the client and server arises by virtue of computer programs running on the respective computers and having a client-server relationship to each other. In some embodiments, a server transmits information/data (e.g., an HTML page) to a client device (e.g., for purposes of displaying information/data to and receiving user input from a user interacting with the client device). Information/data generated at the client device (e.g., a result of the user interaction) can be received from the client device at the server.

While this specification contains many specific implementation details, these should not be construed as limitations on the scope of any inventions or of what may be claimed, but rather as descriptions of features specific to particular embodiments of particular inventions. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

CONCLUSION

Many modifications and other embodiments of the disclosure set forth herein will come to mind to one skilled in the art to which this disclosure pertains having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

What is claimed is:

1. A flexible battery comprising:
    a single battery laminate with a first layer comprising at least one cathode segment and a first separator segment, and a second layer comprising at least one anode segment and a second separator segment, wherein the at least one cathode segment opposes the second separator segment, and the at least one anode segment opposes the first separator segment;
    a first portion with a first stack thickness, the first portion comprising a first sub-portion of the single battery laminate in a first orientation, a second sub-portion of the single battery laminate adjacent to the first sub-portion and oriented in a second orientation that is opposite the first orientation, and a third sub-portion of the single battery laminate adjacent to the second sub-portion and oriented in the first orientation;
    a second portion with a second stack thickness that is less than the first stack thickness, the second portion comprising a fourth sub-portion of the single battery laminate oriented in the first orientation, a fifth sub-portion of the single battery laminate adjacent to the fourth sub-portion and oriented in the second orientation; and
    a third portion with a third stack thickness that is less than the second stack thickness, the third portion comprising
    a sixth sub-portion of the single battery laminate oriented in the first orientation, wherein the second portion is in between the first portion and the third portion.

2. The flexible battery of claim 1, wherein the first sub-portion comprises the at least one cathode segment, and the second sub-portion comprises the first separator segment, and wherein the first separator segment is positioned between the at least one cathode segment and the at least one anode segment.

3. The flexible battery of claim 1, wherein the flexible battery further comprises:
    a fourth portion of the single battery laminate connecting the first sub-portion and the second sub-portion, the fourth portion having a first length;
    a fifth portion of the single battery laminate connecting the second sub-portion and the third sub-portion, wherein the fourth portion has a second length that is greater than the first length; and
    a sixth portion of the single battery laminate connecting the fourth sub-portion and the fifth sub-portion, wherein the sixth portion has a third length that is longer than the second length.

4. The flexible battery of claim 1, wherein the first portion comprises a first lateral axis through a first center of the first stack thickness, the second portion comprises a second lateral axis through a second center of the second stack thickness, and the third portion comprises a third lateral axis through a third center of the third stack thickness; and
    wherein the first lateral axis is aligned with the second lateral axis, and the second lateral axis is aligned with the third lateral axis.

5. The flexible battery of claim 1, wherein the first portion comprises a first lateral axis through a first center of the first stack thickness and the second portion comprises a second lateral axis through a second center of the second stack thickness; and
    wherein the second lateral axis is offset from the first lateral axis.

6. The flexible battery of claim 5, wherein the third portion comprises a third lateral axis through a third center of the third stack thickness; and
    wherein the third lateral axis is offset from the second lateral axis.

7. The flexible battery of claim 1, further comprising a coating that increases rigidity of the flexible battery, wherein the first portion is coated with a first amount of the coating and the second portion is coated with a second amount of the coating that is less than the first amount.

8. The flexible battery of claim 1, wherein the sixth sub-portion of the third portion is adjacent to the fifth sub-portion of the second portion.

9. A flexible battery comprising:
    a single battery laminate with a first layer comprising at least one cathode segment and a first separator segment, and a second layer comprising at least one anode segment and a second separator segment, wherein the at least one cathode segment opposes the second separator segment, and the at least one anode segment opposes the first separator segment;
    a first portion with a first stack thickness, the first portion comprising a first sub-portion of the single battery laminate in a first orientation, a second sub-portion of the single battery laminate adjacent to the first sub-portion and oriented in a second orientation that is opposite the first orientation, and a third sub-portion of the single battery laminate adjacent to the second sub-portion and oriented in the first orientation;

a second portion with a second stack thickness that is less than the first stack thickness, the second portion comprising a fourth sub-portion of the single battery laminate oriented in the first orientation, a fifth sub-portion of the single battery laminate adjacent to the fourth sub-portion and oriented in the second orientation; and a third portion of the single battery laminate, the third portion having a third stack thickness that is less than the second stack thickness, wherein the second portion is in between the first portion and the third portion.

10. The flexible battery of claim 9, wherein the first sub-portion comprises the at least one cathode-segment, and the second sub-portion comprises the first separator segment, and wherein the first separator segment is positioned between the at least one cathode segment and the at least one anode segment.

11. The flexible battery of claim 9, wherein the flexible battery further comprises:
   a fourth portion of the single battery laminate connecting the first sub-portion and the second sub-portion, the fourth portion having a first length; and
   a fifth portion of the single battery laminate connecting the second sub-portion and the third sub-portion, wherein the fifth portion has a second length that is greater than the first length.

12. The flexible battery of claim 9, wherein the first portion comprises a first lateral axis through a first center of the first stack thickness, wherein the second portion comprises a second lateral axis through a second center of the second stack thickness, and wherein the first lateral axis is aligned with the second lateral axis.

13. The flexible battery of claim 9, wherein the first portion comprises a first lateral axis through a first center of the first stack thickness, wherein the second portion comprises a second lateral axis through a second center of the second stack thickness, and wherein the second lateral axis is offset from the first lateral axis.

14. The flexible battery of claim 9, further comprising a coating that increases rigidity of the flexible battery, wherein the first portion is coated with a first amount of the coating and the second portion is coated with a second amount of the coating that is less than the first amount.

15. The flexible battery of claim 9, the third portion comprising a sixth sub-portion adjacent to the fifth sub-portion.

16. The flexible battery of claim 13, wherein the third portion comprises a third lateral axis through a third center of the third stack thickness; and
   wherein the third lateral axis is offset from the second lateral axis.

* * * * *